United States Patent
Schlezinger et al.

(10) Patent No.: US 12,046,498 B2
(45) Date of Patent: Jul. 23, 2024

(54) METHOD AND APPARATUS FOR CONTINUOUS SUBSTRATE CASSETTE LOADING

(71) Applicant: Applied Materials, Inc., Santa Clara, CA (US)

(72) Inventors: Asaf Schlezinger, Modi'in (IL); Markus J. Stopper, Voerstetten (DE)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/196,721

(22) Filed: May 12, 2023

(65) Prior Publication Data
US 2023/0282504 A1    Sep. 7, 2023

Related U.S. Application Data

(63) Continuation of application No. 17/118,277, filed on Dec. 10, 2020, now Pat. No. 11,688,618.

(51) Int. Cl.
*H01L 21/677* (2006.01)
*B65G 47/26* (2006.01)
(Continued)

(52) U.S. Cl.
CPC ...... *H01L 21/67736* (2013.01); *B65G 47/268* (2013.01); *B65G 47/52* (2013.01);
(Continued)

(58) Field of Classification Search
CPC ......... H05K 3/34; H01L 21/677; H01L 21/60; H01L 21/6773; B65G 1/00; B65G 17/12;
(Continued)

(56) References Cited

U.S. PATENT DOCUMENTS 5,476,191 A * 12/1995 Dunford .............. B65G 59/068
                                                     221/253
6,705,828 B2    3/2004 Soraoka et al.
(Continued)

FOREIGN PATENT DOCUMENTS

CH            681298    *  2/1993    ............. B65G 59/06
JP         3196596 B2      8/2001
(Continued)

OTHER PUBLICATIONS

International Search Report and Written Opinion dated Feb. 9, 2022 for Application No. PCT/2021/055656.**.

*Primary Examiner* — James R Bidwell
(74) *Attorney, Agent, or Firm* — Patterson + Sheridan, LLP

(57) ABSTRACT

A method and apparatus for loading substrates in an inspection station is disclosed herein. In one embodiment a loading module is disclosed that includes a loading station for two or more substrate cassettes, a first lane comprising a first conveyor that is substantially aligned with one of the two or more substrate cassettes and a conveyor system, a second lane comprising a second conveyor that is substantially aligned with another of the two or more substrate cassettes and positioned in a spaced-apart relation relative to the first lane, and a lateral transfer module positioned between the first lane and the second lane that is adapted to move substrates from the second lane to the first lane.

19 Claims, 10 Drawing Sheets

(51) Int. Cl.
*B65G 47/52* (2006.01)
*G01N 21/95* (2006.01)

(52) U.S. Cl.
CPC ... *G01N 21/9501* (2013.01); *H01L 21/67706* (2013.01); *H01L 21/6773* (2013.01)

(58) Field of Classification Search
CPC ...... B65G 47/268; B65G 47/52; B65G 61/00; B65G 59/107; B65G 59/068; B65G 59/067; B65G 47/68; F27D 11/00; G01N 21/84; G01N 21/88; G01N 21/9501
USPC ........................................ 198/448; 414/797.4
See application file for complete search history.

(56) References Cited

U.S. PATENT DOCUMENTS

| | | |
|---|---|---|
| 9,341,580 B2 | 5/2016 | Schlezinger et al. |
| 10,092,929 B2 | 10/2018 | Bonora et al. |
| 10,403,533 B2 | 9/2019 | Stopper et al. |
| 10,507,991 B2 | 12/2019 | Schlezinger et al. |
| 10,777,436 B2 | 9/2020 | Stopper et al. |
| 11,358,793 B2 | 6/2022 | Garcia et al. |
| 2009/0245985 A1 | 10/2009 | Matsuba |
| 2012/0132638 A1 | 5/2012 | Rey Garcia et al. |
| 2019/0337734 A1 | 11/2019 | Schlezinger et al. |

FOREIGN PATENT DOCUMENTS

| | | |
|---|---|---|
| JP | 2008064666 A | 3/2008 |
| KR | 20110077681 A | 7/2011 |
| KR | 20120049016 A | 5/2012 |
| WO | 2004010171 A1 | 1/2004 |

\* cited by examiner

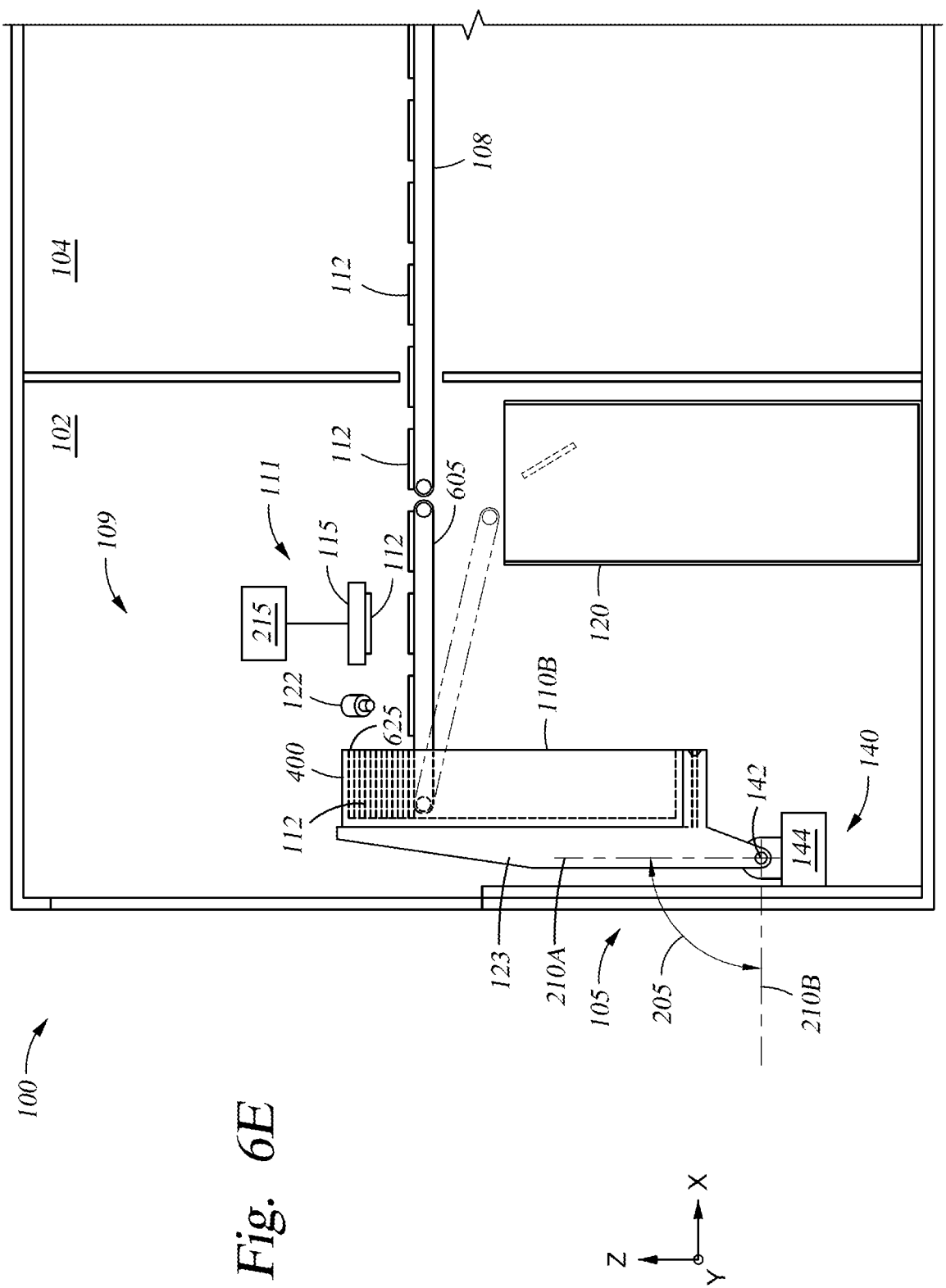

METHOD AND APPARATUS FOR CONTINUOUS SUBSTRATE CASSETTE LOADING

CROSS-REFERENCE TO RELATED APPLICATIONS

This application is a continuation of U.S. patent application Ser. No. 17/118,277; filed on Dec. 10, 2020; which is incorporated by reference herein in its entirety.

FIELD

Embodiments of the present disclosure generally relate to substrate loading equipment. More specifically, embodiments disclosed herein relate to a system and method for loading substrates into solar substrate inspection equipment using a loading module that accommodates multiple cassettes.

BACKGROUND

Substrates, such as substrates including a plurality of photovoltaic devices formed thereon, that are utilized as solar panels, are routinely inspected during processing at independent inspection stations to ensure compliance with predetermined quality control standards. Different inspection techniques provide comprehensive data regarding products and processes. These inspection processes have continued to decrease the amount of time required to complete required inspection steps which increases productivity of the systems.

These inspection systems typically load substrates that are to be inspected using a cassette that holds multiple substrates that are fed into the system one at a time. However, as one cassette is emptied of substrates, the empty cassette must be removed, and another cassette with substrates must be installed. This cassette swap takes time which negatively impacts the productivity of the inspection system. Therefore, conventional loading apparatuses need to be improved to be able to keep up with the increased throughput of the conventional inspection systems.

Thus, there is a need for an improved substrate loading apparatus for use with inspection systems in order to reduce system downtime.

SUMMARY

A method and apparatus for loading substrates in an inspection station is disclosed herein. In one embodiment a loading module is disclosed that includes a loading station for two or more substrate cassettes, a first lane comprising a first conveyor that is substantially aligned with one of the two or more substrate cassettes and a conveyor system, a second lane comprising a second conveyor that is substantially aligned with another of the two or more substrate cassettes and positioned in a spaced-apart relation relative to the first lane, and a lateral transfer module positioned between the first lane and the second lane that is adapted to move substrates from the second lane to the first lane.

In another embodiment, a substrate inspection system is disclosed. The substrate inspection system includes a loading module, an inspection unit, and a sorting unit coupled to each other by a conveyor system for moving substrates through the system. The loading module comprises a loading station for two or more substrate cassettes, a first lane comprising a first conveyor that is substantially aligned with one of the two or more substrate cassettes and the conveyor system, a second lane comprising a second conveyor that is substantially aligned with another of the two or more substrate cassettes and positioned in a spaced-apart relation relative to the first lane, and a lateral transfer module positioned between the first lane and the second lane that is adapted to move substrates from the second lane to the first lane.

In another embodiment, a substrate inspection system is disclosed. The inspection system includes a loading module, an inspection unit, and a sorting unit coupled to each other by a conveyor system for moving substrates through the system. The loading module comprises a loading station for two or more substrate cassettes, a first lane comprising a first conveyor disposed in a first direction that is substantially aligned with one of the two or more substrate cassettes and the conveyor system, a second lane comprising a second conveyor that is disposed in a second direction substantially aligned with another of the two or more substrate cassettes and positioned in a spaced-apart relation relative to the first direction, and a lateral transfer module positioned in a third direction substantially orthogonal to the first and second directions between the first lane and the second lane, the lateral transfer module comprising a conveyor device that is that is adapted to move substrates from the second lane to the first lane.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 6A-6E are schematic side views of a cassette transfer mechanism showing a sequence of loading the cassette of FIGS. 4 and 5 for transfer of substrates to a conveyor similar to the first conveyor or the second conveyor shown in FIG. 1.

For clarity, identical reference numerals have been used, where applicable, to designate identical elements that are common between figures. Additionally, elements of one embodiment may be advantageously adapted for utilization in other embodiments described herein.

DETAILED DESCRIPTION

Figure 1:
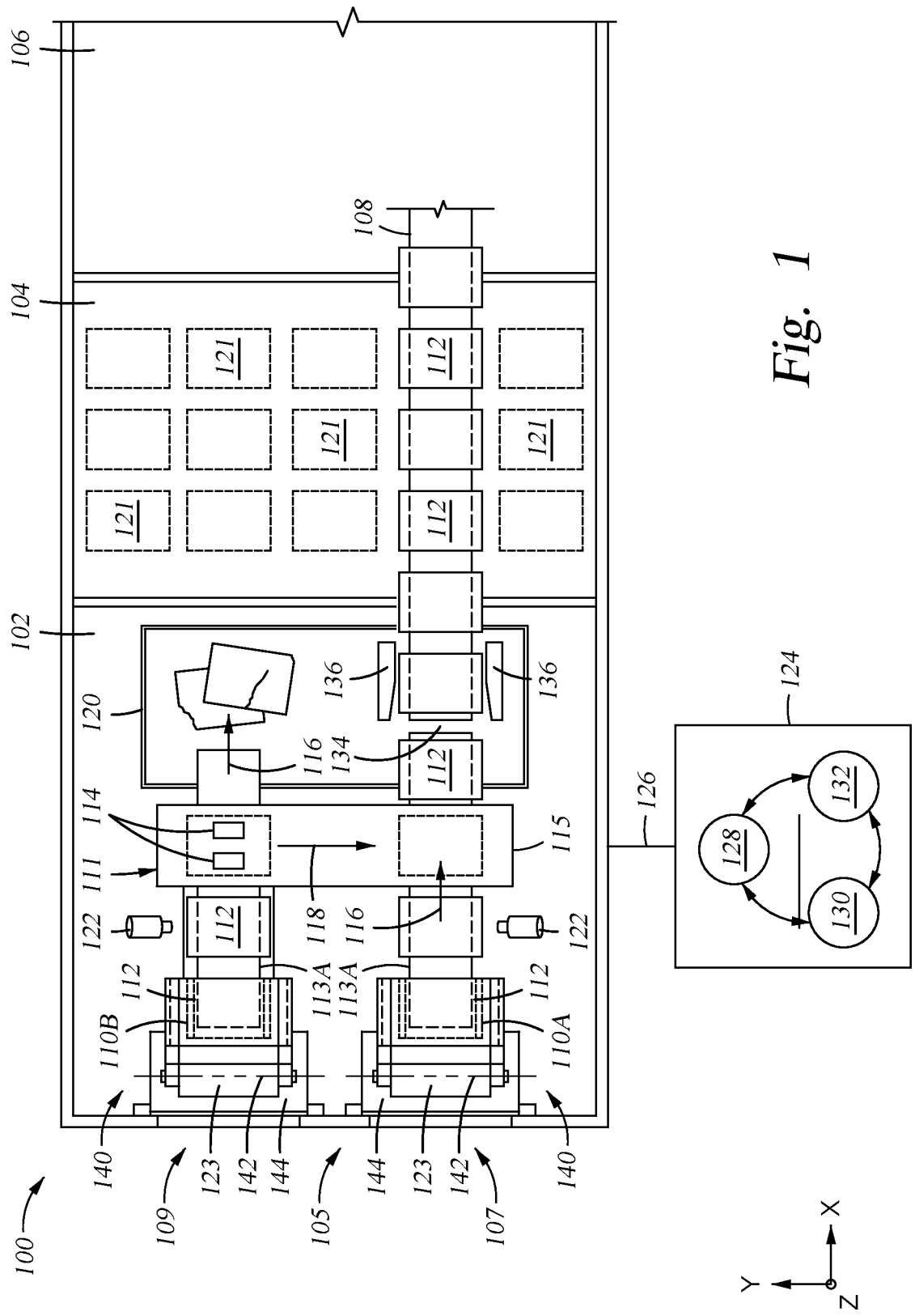
FIG. 1 illustrates a top plan view of a substrate inspection system, according to one embodiment.

FIG. 1 illustrates a top plan view of an inspection system 100 for inspecting substrates, according to one embodiment. The inspection system 100 includes a loading module 102, a modular inspection unit 104, and a sorting unit 106. Each of the loading module 102, the modular inspection unit 104 and the sorting unit 106 have a conveyor system 108 (a main conveyor) provided therein. The conveyor system 108 may include one or multiple conveyor units such that substrates are moved from the loading module 102, through the modular inspection unit 104, to the sorting unit 106. For example, the conveyor system 108 may include a conveyor that extends into the loading module 102, a conveyor that extends from the loading module 102 into the modular inspection unit 104, and a conveyor that extends from the modular inspection unit 104 to the sorting unit 106. Alternatively, the conveyor system 108 may be a single conveyor that extends at least partially into the loading module 102 through the modular inspection unit 104 to the sorting unit 106.

In one embodiment, the modular inspection unit 104 may include one or more metrology stations 121. The metrology stations 121 may include, by way of example only, any of the following: a micro-crack inspection unit, a thickness measuring unit, a resistivity measuring unit, a photoluminescence unit, a geometry inspection unit, a saw mark detection unit, a stain detection unit, a chip detection unit, and/or a crystal fraction detection unit. The micro-crack inspection unit may be, by way of example only, configured to inspect substrates for cracks, as well as to optionally determine crystal fraction of a substrate. The geometry inspection unit may be configured, by way of example only, to analyze surface properties of a substrate. The saw mark detection unit may be configured, by way of example only, to identify saw marks including groove, step, and double step marks on a substrate. The metrology stations 121 may also include other examples beyond those listed.

The loading module 102, the modular inspection unit 104, and the sorting unit 106 are connected in a serial arrangement such that a substrate may be easily and rapidly passed among the loading module 102, the modular inspection unit 104 and the sorting unit 106 by the conveyor system 108 without exiting the inspection system 100. In one example, the loading module 102, the modular inspection unit 104, and the sorting unit 106 are connected in a linear arrangement.

The loading module 102 of the inspection system 100 includes a loading station 105, a primary or first lane 107 having the conveyor system 108 substantially aligned therewith, and a secondary or second lane 109 that is offset laterally from the first lane 107. A lateral transfer module 111 is interfaced between the first lane 107 and the second lane 109. The lateral transfer module 111 is configured to move substrates from the second lane 109 to the first lane 107.

The loading module 102 is configured to load substrates for transfer through the modular inspection unit 104 and the sorting unit 106 by the conveyor system 108. The conveyor system 108 conveys inspected substrates from the modular inspection unit 104 towards the sorting unit 106. The conveyor system 108 may deliver inspected substrates into the sorting unit 106 to a location within reach of a sorting system (not shown) housed with sorting unit 106. The sorting unit 106 generally includes a plurality of bins (not shown) where the inspected substrates may be sorted into the sorting bins in response to one or more substrate characteristics determined during one or more of the inspection processes performed in the modular inspection unit 104. In one embodiment, the conveyor system 108 may be a continuous conveyor belt running through the inspection system 100. In another embodiment, the conveyor system 108 may include more than one conveyor belt running through the inspection system 100. The one or more conveyor belts may be disposed sequentially, for example in a linear arrangement, to transfer substrates received in the loading module 102 to the modular inspection unit 104.

The loading station 105 of the loading module 102 receives a plurality of cassettes, such as a first cassette 110A and a second cassette 110B. Each of the first cassette 110A and the second cassette 110B contain a plurality of substrates 112 in a stacked configuration. The cassettes 110A and 110B may be positioned such that the substrates 112 are stacked one over the other within each of the first cassette 110A and the second cassette 110B. The first cassette 110A is contained in a cassette receiver 123 and the second cassette 110B is contained in a cassette receiver 123.

Both of the first lane 107 and the second lane 109 include a conveyor, such as a first conveyor 113A and a second conveyor 113B, respectively. In some embodiments, both of the first conveyor 113A and the second conveyor 113B are separate and distinct from the conveyor system 108. However, the first conveyor 113A is aligned with the conveyor system 108 such that substrates may be seamlessly transfer from the first conveyor 113A directly to the conveyor system 108. The lateral transfer module 111 is oriented in a cross-machine direction to each of the first lane 107 and the second lane 109. The lateral transfer module 111 is utilized to transfer substrates between the second lane 109 and the first lane 107. Any of the first conveyor 113A, the second conveyor 113B and the conveyor system 108 include belts or other continuous transfer medium using vacuum, electrostatic force, clamping or gravity to retain the substrates while transferring substrates thereon. Each cassette receiver 123 (and a respective cassette supported thereon or therein) is independently pivotable and/or linearly movable (at least in the X/Y plane and the Z direction) relative to the first conveyor 113A and/or the second conveyor 113B. The interaction of the cassette receivers 123 and the first conveyor 113A and the second conveyor 113B will be described in greater detail below.

The lateral transfer module 111 is adapted to move substrates 112 from the second lane 109 to the first lane 107 using one or more robotic devices 114 or a conveyor device, such as a belt 115. The one or more robotic devices 114 include pick and place devices, one or more robot arms, or combinations thereof. The belt 115 may use gravity or vacuum to move substrates thereon. The first conveyor 113A and the second conveyor 113B are adapted to move substrates 112 from the first cassette 110A and the second cassette 110B, respectively, in the X direction (or direction 116). The belt 115 or the one or more robotic devices 114 are adapted to move substrates from the second conveyor 113B to the first conveyor 113A, for example in the Y direction (or direction 118).

Both of the first lane 107 and the second lane 109 include a waste bin 120 adapted to collect broken, chipped or otherwise damaged substrates 112 (collectively "undesired substrate"). An example of an undesired substrate includes a substrate with visible damage, such as cracks, chips, or broken off corners and/or edges. In another example, an undesired substrate would include two substrates that are stacked on top of one another, e.g., a double substrate. While not shown, each of the first lane 107 and the second lane 109 include a dedicated waste bin 120 instead of a single bin for both the first lane 107 and the second lane 109.

Substrates 112 from each of the first cassette 110A and the second cassette 110B are viewed by an image capture device 122. The image capture device 122 may be a camera, a charge-coupled device (CCD), or other device suitable for determining that the substrate is unsuitable or undesired for further transport to the modular inspection unit 104. Each lane 107, 109 may have a separate image capture device 122. In the second lane 109, the image capture device 122 is positioned to capture images from substrates 112 moving on the second lane 109 prior to the substrates 112 reaching a position where the substrates 112 may be transferred to the lateral transfer module 111.

The inspection system 100 further include a controller 124. The inspection system 100 is coupled to the controller 124 by a communications cable 126. The controller 124 is operable to control processing of substrates 112 within the inspection system 100. The controller 124 includes a programmable central processing unit (CPU) 128 that is operable with a memory 130 and a mass storage device, an input control unit, and a display unit (not shown), such as power supplies, clocks, cache, input/output (I/O) circuits, and the like, coupled to the various components of the inspection system 100 to facilitate control of the processes of handling and inspecting the substrates. The controller 124 may also include hardware for monitoring the processing of a substrate through sensors (not shown) in the inspection system 100.

To facilitate control of the inspection system 100 and processing a substrate, the CPU 128 may be one of any form of general-purpose computer processors for controlling the substrate process. The memory 130 is coupled to the CPU 128 and the memory 130 is non-transitory and may be one or more of readily available memory such as random access memory (RAM), read only memory (ROM), floppy disk drive, hard disk, or any other form of digital storage, local or remote. Support circuits 132 are coupled to the CPU 128 for supporting the CPU 128 in a conventional manner. The process for loading substrates by operation of the loading module 102 may be stored in the memory 130. The process for loading substrates may also be stored and/or executed by a second CPU (not shown) that is remotely located from the hardware being controlled by the CPU 128.

The memory 130 is in the form of computer-readable storage media that contains instructions, that when executed by the CPU 128, facilitates the operation of the inspection system 100. The instructions in the memory 130 are in the form of a program product such as a program that implements the operation of the inspection system 100, including for example the operation of the loading module 102. The program code may conform to any one of a number of different programming languages. In one example, the disclosure may be implemented as a program product stored in computer readable storage media for use with a computer system. The program(s) of the program product define functions of the embodiments. Illustrative computer-readable storage media include, but are not limited to: (i) non-writable storage media (e.g., read-only memory devices within a computer such as CD-ROM disks readable by a CD-ROM drive, flash memory, ROM chips or any tope of solid-state non-volatile semiconductor memory) on which information is permanently stored; and (ii) writing storage media (e.g. floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

The image capture devices 122 work in conjunction with the controller 124 to determine whether substrates 112 are sent to the waste bin 120 or continue into the modular inspection unit 104. A standard picture analysis algorithm or other suitable algorithm may be used to analyze the image to determine whether the substrate 112 is undesired or suitable for further inspection. In one example, the outline of the substrate 112 is measured and the area of the substrate is calculated from the outline. If the area of the substrate 112 is smaller than a certain surface area, the substrate is considered broken, and thus undesired. If the area of the substrate 112 is larger than a certain surface area, the substrate is considered a double substrate, and thus undesired.

Undesired substrates from the second cassette 110B may travel on the second conveyor 113B in the direction 116 past the lateral transfer module 111 to the waste bin 120. Thus, any undesired substrates are not transferred to the first lane 107 using the lateral transfer module 111. Undesired substrates from the first cassette 110A are transferred to the waste bin 120 using a movable conveyor 134. Based on instructions from the controller 124, the movable conveyor 134 may move to allow the undesired substrate(s) to drop from the first conveyor 113A into the waste bin 120. In one example, the movable conveyor 134 moves in the Z direction such that undesired substrates may be transferred to the waste bin 120. The movable conveyor 134 then repositions to allow substrates to travel on to the modular inspection unit 104 on the conveyor system 108. Along the first lane 107, an alignment device 136 is positioned. The alignment device 136 positions the substrates 112 in proper alignment for transfer into the modular inspection unit 104.

The loading station 105 includes the cassette receivers 123 for each of the first cassette 110A and the second cassette 110B. The loading station 105 also includes a cassette transfer mechanism 140 for each of the first lane 107 and the second lane 109. Each of the cassette transfer mechanisms 140 facilitate movement of the cassette receivers 123 (and a cassette positioned therein) independently relative to the first conveyor 113A and the second conveyor 113B. Each of the cassette transfer mechanisms 140 include a dedicated pivot or hinge device 142. Each hinge device 142 is coupled to an actuator 144. Each actuator 144 moves the respective hinge device 142, the respective cassette receiver 123 (and a cassette positioned therein) in the X/Y plane and vertically (Z direction) relative to the respective first conveyor 113A and second conveyor 113B. The movement of the cassette transfer mechanism 140 will be described in more detail below.

In operation, substrates 112 are transferred from the first cassette 110A positioned at the first lane 107 to the conveyor system 108 until all of the substrates 112 within the first cassette 110A are gone. During this time, substrates 112 that are deemed undesired are transferred to the waste bin 120 while substrates 112 that are desired travel from the first conveyor 113A to the conveyor system 108 in the direction 116. Then, substrates 112 from the second cassette 110B, positioned at the second lane 109, are transferred to the second conveyor 113B. Substrates 112 moving on the second conveyor 113B are inspected using the image capture device 122 prior to reaching the lateral transfer module 111. During this time, substrates 112 that are deemed undesired are transferred to the waste bin 120, while substrates 112 that are desired travel to the first conveyor 113A to the conveyor system 108 using the lateral transfer module 111. While the substrates 112 from the second cassette 110B are being loaded, the first cassette 110A, now empty, may be replaced with another cassette with new (uninspected) substrates, while the conveyor system 108 receives the substrates 112 from the second cassette 110B. Similarly, when the substrates 112 within the second cassette 110B have all been transferred to the second conveyor 113B, the second cassette 110B may be replaced with another cassette with new (uninspected) substrates while the conveyor system 108 receives the substrates 112 from the first cassette 110A via the lateral transfer module 111.

Conventional inspection systems typically load substrates that are to be inspected using a cassette similar to one of the first cassette 110A or the second cassette 110B. However, as one cassette is emptied of substrates, the empty cassette must be removed, and another cassette with substrates must be installed which causes downtime of the inspection system. However, according to embodiments described herein, the loading module 102 may be operated at or near zero dead time. In some embodiments, the loading module 102 having the lateral transfer module 111 as described herein increases productivity of the inspection system 100 by about 10% as compared to conventional inspection tools.

Figure 2:
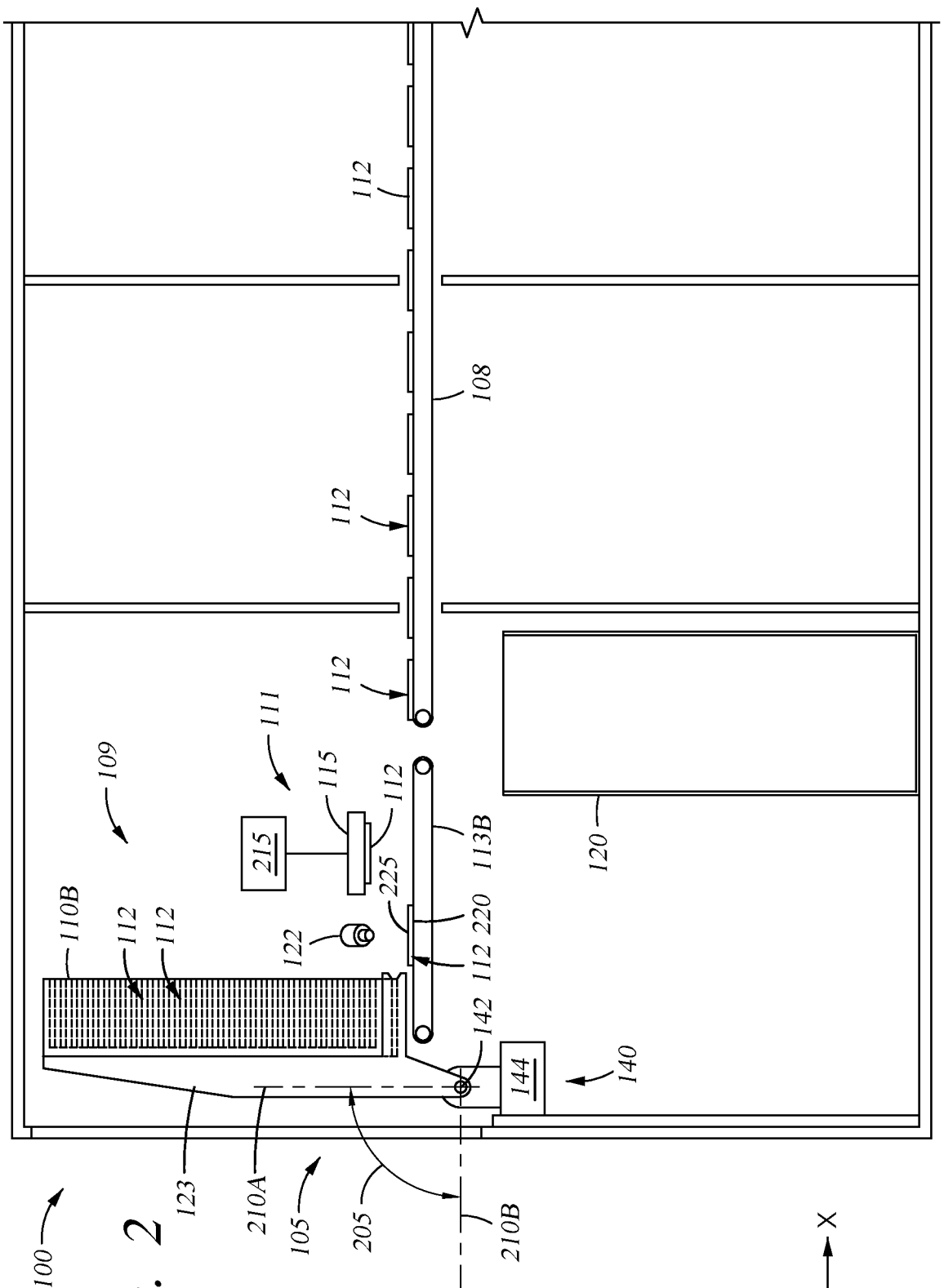
FIG. 2 is a schematic side view of a portion of the inspection system of FIG. 1.

FIG. 2 is a schematic side view of a portion of the inspection system 100 of FIG. 1 showing details of one embodiment of the lateral transfer module 111. The first lane 107 is not shown in this Figure so that details of the second lane 109 can be seen. The second cassette 110B is shown positioned above the second conveyor 113B. The second cassette 110B, supported by the cassette receiver 123, includes a plurality of stacked substrates 112. The second conveyor 113B is at least partially inserted in the second cassette 110B below the lowermost substrate disposed in the second cassette 110B. The second cassette 110B is similar to the first cassette 110A shown in FIG. 1. Additionally, the first conveyor 113A shown in FIG. 1 is inserted at least partially into the first cassette 110A using a cassette receiver 123 similar to the orientation of the second conveyor 113B shown in FIG. 2. The second cassette 110B and cassette receiver 123 is positioned on the dedicated pivot or hinge device 142 such that the second cassette 110B and the cassette receiver 123 can be tilted in a direction 205. While not shown, the first cassette 110A (housed in or supported by a cassette receiver 123) includes a dedicated hinge device 142 such that the first cassette 110A and the cassette receiver 123 can be tilted independently in the direction 205.

The second cassette 110B and cassette receiver 123 (as well as the first cassette 110A (and cassette receiver 123) independent of the second cassette 110B) is tilted to a first orientation 210A (vertically) as shown for unloading of substrates 112. When the second cassette 110B is emptied of substrates 112, the second cassette 110B (and cassette receiver 123) is tilted to a second orientation 210B that is substantially normal to the first direction (horizontally) for removal of the emptied second cassette 110B and loading of a full cassette. Then the full cassette (a new second cassette 110B) is tilted to the first orientation 210A in the cassette receiver 123. Each cassette moves in the direction 205 independently. The hinge device 142 may be coupled to the actuator 144 that moves the cassette in the direction 205 as well as in the X direction over the second conveyor 113B. The actuator 144 also moves the cassette receiver 123 (and cassette contained therein) downward (in the Z direction) as substrates 112 are transferred from the cassette to the second conveyor 113B.

In this embodiment, the lateral transfer module 111 includes the belt 115, which is coupled to a vacuum apparatus 215. The belt 115 includes a plurality of vacuum holes or is permeable to allow vacuum, provided by the vacuum apparatus 215, to secure substrates to the belt 115.

In operation, the second cassette 110B is lowered so that a first major surface 220 of the bottommost substrate 112 disposed in the second cassette 110B is set on the second conveyor 113B. The second conveyor 113B removes the substrate laterally from the second cassette 110B. The second cassette 110B continues to lower so that the next and now newly bottommost substrate contacts the second conveyor 113B and is removed by the second conveyor 113B from the second cassette 110B in the same manner. The second cassette 110B continues to lower until all of the substrates have been removed from the second cassette 110B by the second conveyor 113B.

The substrate 112 leaving the second cassette 110B on the second conveyor 113B passes the image capture device 122. The image capture device 122 captures one or more images of the moving substrate from which it is determined whether the substrate is desired or not. If the substrate 112 is desired, the substrate 112 travels on the second conveyor 113B to a position below the belt 115. Then the vacuum apparatus 215 attracts the substrate 112 towards the belt 115 such that a second surface 225 of the substrate 112 is suctioned to the belt 115, essentially transferring the substrate from the second conveyor 113B to the belt 115. The substrate 112 then travels with the belt 115 along the direction 118 (shown in FIG. 1) or the Y direction, toward the first conveyor 113A (shown in FIG. 1). Then, the substrate 112 is released from the belt 115, of example by removing the vacuum from below the substrate 112, and the substrate 112 is transferred to the first conveyor 113A on the first major surface 220 of the substrate 112. The substrate 112 then travels in the X direction on the conveyor system 108 to the modular inspection unit 104 where it may be inspected. If the substrate 112 is determined to be undesired, the substrate 112 passes beyond the belt 115 on the second conveyor 113B to the waste bin 120. The above described sequences continue until the second cassette 110B is emptied of substrates 112 at which time the first cassette 110A will be ready for transfer of new substrates to the first lane 107.

Figure 3:
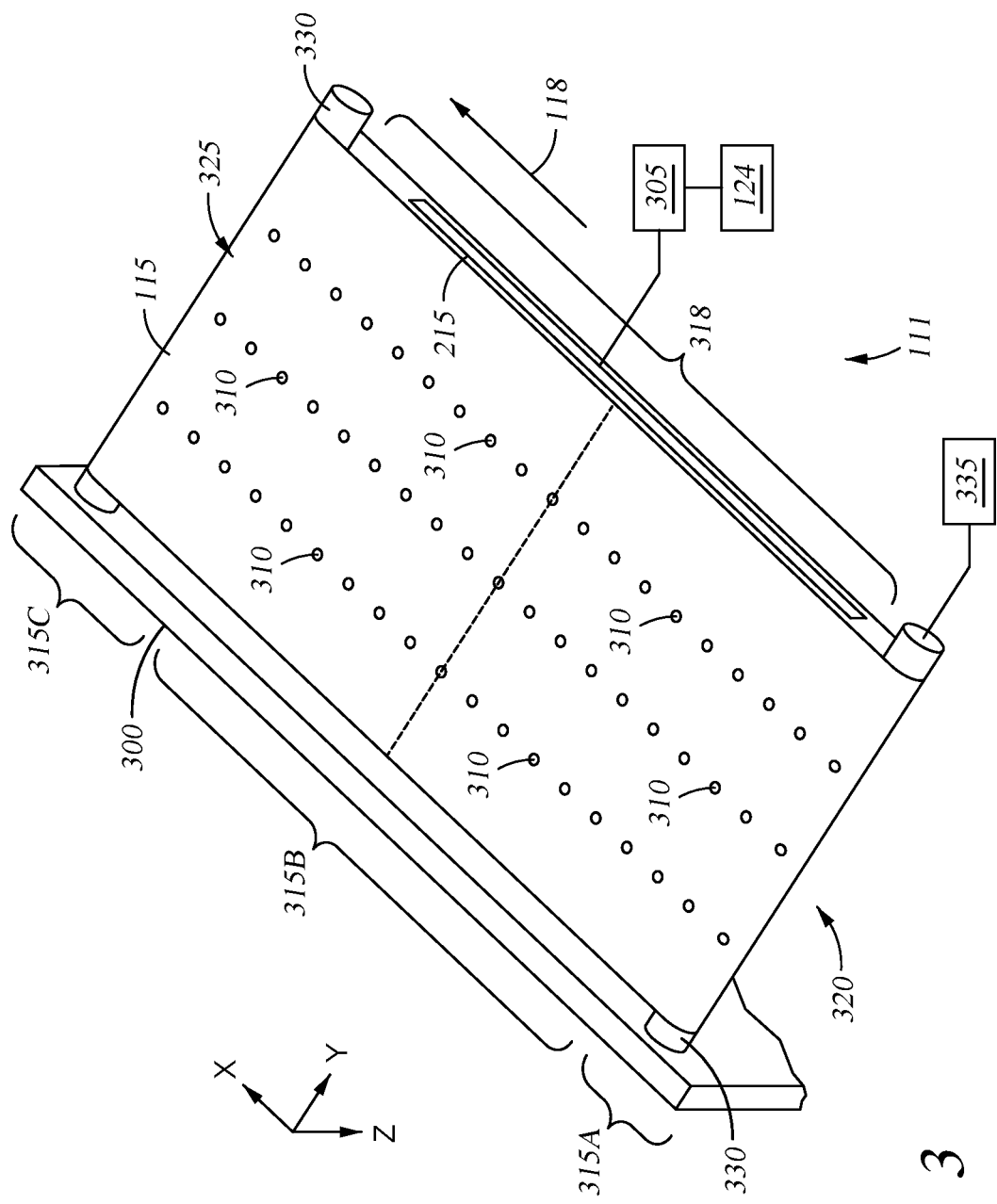
FIG. 3 is an isometric bottom view of the first conveyor module.

FIG. 3 is an isometric bottom view of the lateral transfer module 111. The lateral transfer module 111 includes a support member 300 that is utilized to mount the lateral transfer module 111 to the loading module 102 (shown in FIGS. 1 and 2). The vacuum apparatus 215 is shown adjacent to the belt 115. The vacuum apparatus 215 is fluidly coupled to a pump 305 that facilitates application of a negative pressure (i.e., vacuum) to holes or perforations 310 formed in the belt 115. The pump 305 is coupled to the controller 124 such that suction forces may be controlled.

The vacuum apparatus 215 includes a plurality of sections such as a first section 315A, a second section 315B, and a third section 315C. The second section 315B corresponds with a length of the vacuum apparatus 215 and/or where vacuum application is applied to the perforations 310. Conversely, first section 315A and the third section 315C correspond to areas of the belt 115 where no vacuum is applied to the perforations 310. The lateral transfer module 111 includes a primary end 320 where a substrate 112 (not shown) is initially adhered to the belt 115 from the second conveyor 113B (shown in FIGS. 1 and 2) and a secondary end 325 where the substrate 112 id deposited onto the first conveyor 113A (shown in FIG. 1). The length 318 of the vacuum apparatus 215 may extend closer to the primary end 320 of the lateral transfer module 111 than that of the secondary end 325 of the lateral transfer module 111. Thus, the vacuum apparatus 215 is offset relative to the lateral transfer module 111 such that the third section 315C is longer than the first section 315A.

This offset of the vacuum apparatus 215 relative to the belt 115 may assist in adhering a substrate to the belt 115 at the primary end 320 by providing more vacuum at that end. Similarly, with less vacuum application at the secondary end 325 of the belt 115, the substrate 112 may be more easily dropped from the belt 115 to the first conveyor 113A. For example, negative pressure is applied to more perforations 310 at the primary end 320 of the lateral transfer module 111 as compared to the number of perforations 310 at the secondary end 325 of the lateral transfer module 111. This assures quicker adherence of a substrate to the belt 115. Then the substrate moves with the belt 115 onto the second section 315B to the third section 315C. When in the third section 315C, negative pressure is no longer applied to the perforations 310. Consequently, the lack of vacuum force in the third section 315C allows the substrate to fall away from the belt 115 and onto the first conveyor 113A.

The perforations 310 may be formed through the belt 115 in rows as shown, or in another pattern. Thus, one substrate is picked up by the second section 315B at the primary end 320 while another substrate is simultaneously released from the belt 115 in the third section 315C without interrupting the motion of the belt 115 or the application of vacuum. However, when an undesired substrate is determined using the image capture device 122, vacuum the pump 305 may be discontinued, for example through the use of valves or by turning off the pump 305, such that the undesired substrate is not adhered to the belt 115. Thus, the undesired substrate travels to the waste bin 120 without adhering to the belt 115.

The belt 115 is supported on at least two rollers 330 positioned at opposing ends of the lateral transfer module 111. A drive motor 335 is operably coupled to one of the rollers 330 to move the belt 115 in the direction 118 as described above.

Figure 4:
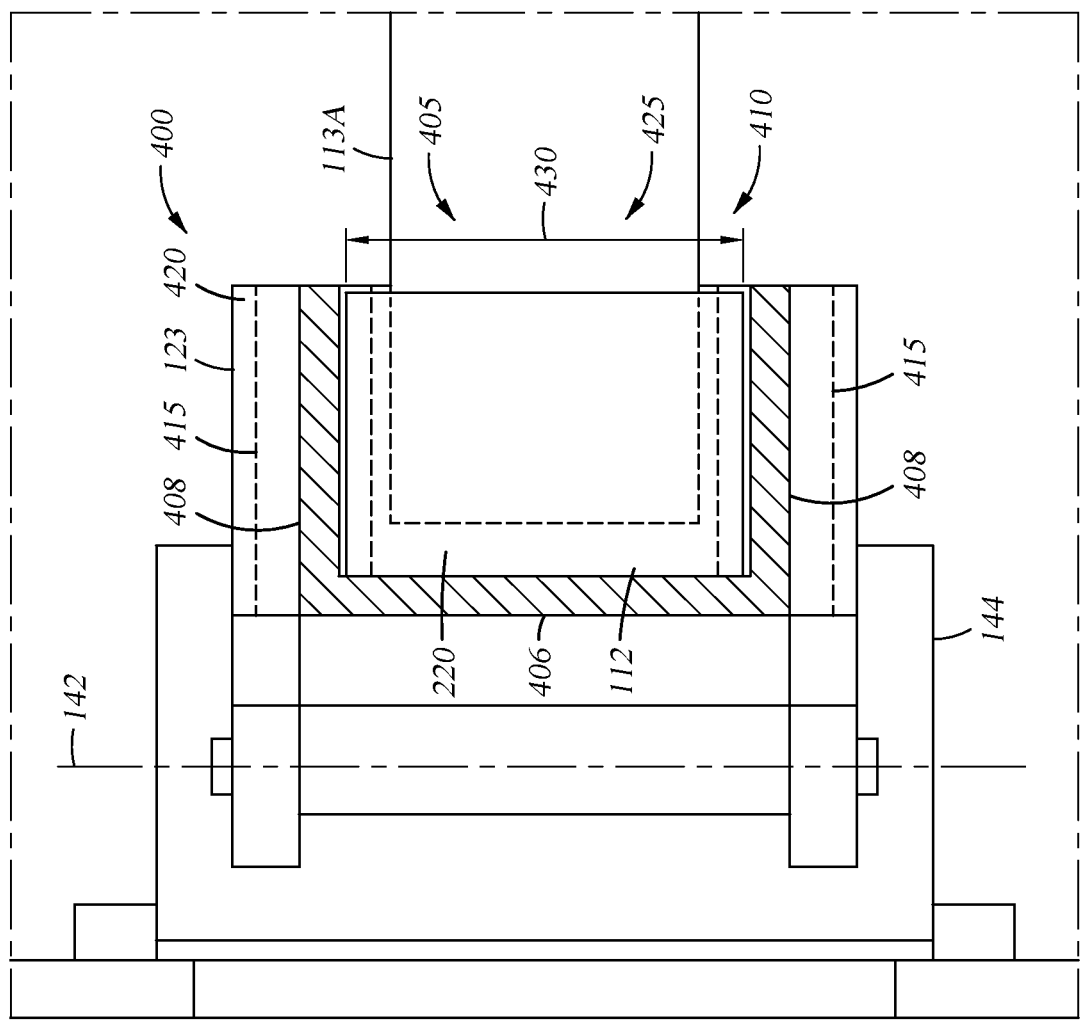
FIG. 4 is a bottom plan view of a cassette which may be the first cassette or the second cassette shown in FIG. 1.

FIG. 4 is a bottom plan view of one embodiment of a cassette 400 as seen from a top surface of the first conveyor 113A or the second conveyor 113B of FIG. 1 (the first conveyor 113A is shown). The cassette 400 is contained within a cassette receiver 123. The cassette 400 is similar to the first cassette 110A and the second cassette 110B. The cassette 400 includes a first open side 405 which may be a bottom of the cassette 400 in the first orientation 210A (FIG. 2). The cassette 400 also includes a sidewall 406 as well as two adjacent sides 408 coupled thereto to form a second open side 410. The second open side 410 may be a top of the cassette 400 in the second orientation 210B (FIG. 2). The first open side 405 provides unrestricted access for the first conveyor 113A or the second conveyor 113B to access the substrates 112. The second open side 410 allows unrestricted movement of substrates 112 in the X direction for transport in the direction 116 shown in FIG. 1. The cassette receiver 123 includes open sides similar to the open sides of the cassette 400. For example, the cassette receiver 123 includes an open side 425 that corresponds with one or both of the first open side 405 and the second open side 410 of the cassette 400. The open side 425 is sized to receive a dimension 430 (e.g., width) of the cassette 400 therein. The open sides of the cassette receiver 123 allow removal of empty cassettes from the cassette receiver 123 as well as insertion of full cassettes into the cassette receiver 123 while in the second orientation 210B (FIG. 2). Additionally, the open side of the cassette receiver 123 corresponding to the first open side 405 of the cassette 400 allows access of the substrates within the cassette 400 to the first conveyor 113A or second conveyor 113B. The cassette 400 includes one or more support members 415. The support member 415 and a receiving slot 420 prevent movement of the cassette 400 relative to the cassette receiver 123. Each support member 415 is adapted to interface with the receiving slot 420 formed in or on the cassette receiver 123.

Figure 5:
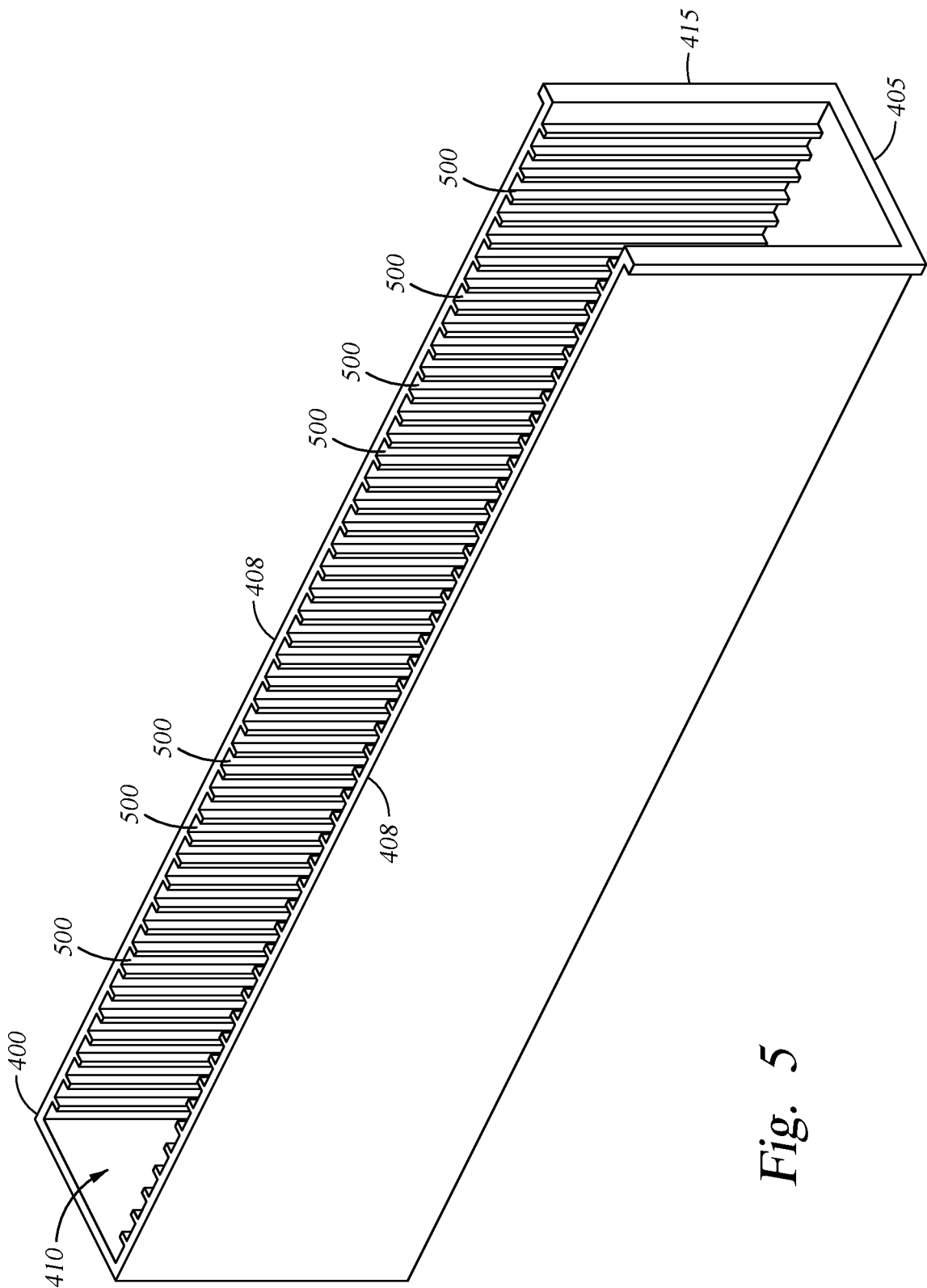
FIG. 5 is an isometric view of the cassette of FIG. 4.

FIG. 5 is an isometric view of the cassette 400 of FIG. 4. In this embodiment, the cassette 400 includes a plurality of slots 500 formed therein. Each of the slots 500 are config-ured to engage and/or support one substrate (not shown). In this embodiment, the slots 500 are configured as shoulders that extend inward from the sides 408. However, in other embodiments, the slots 500 may be provided by posts or protrusions extending inward from each of the sides 408. In some embodiments, the number of slots 500 are about one hundred such that the cassette 400 includes one hundred substrates when full. The cassette 400 also includes the support member 415 that is configured to interface with a cassette receiver 123 (not shown).

FIGS. 6A-6E are schematic side views of the cassette transfer mechanism 140 showing a sequence of loading a cassette 400 for transfer of substrates to a conveyor 605. The conveyor 605 may be either of the first conveyor 113A or the second conveyor 113B shown in FIG. 1.

Figure 6A:
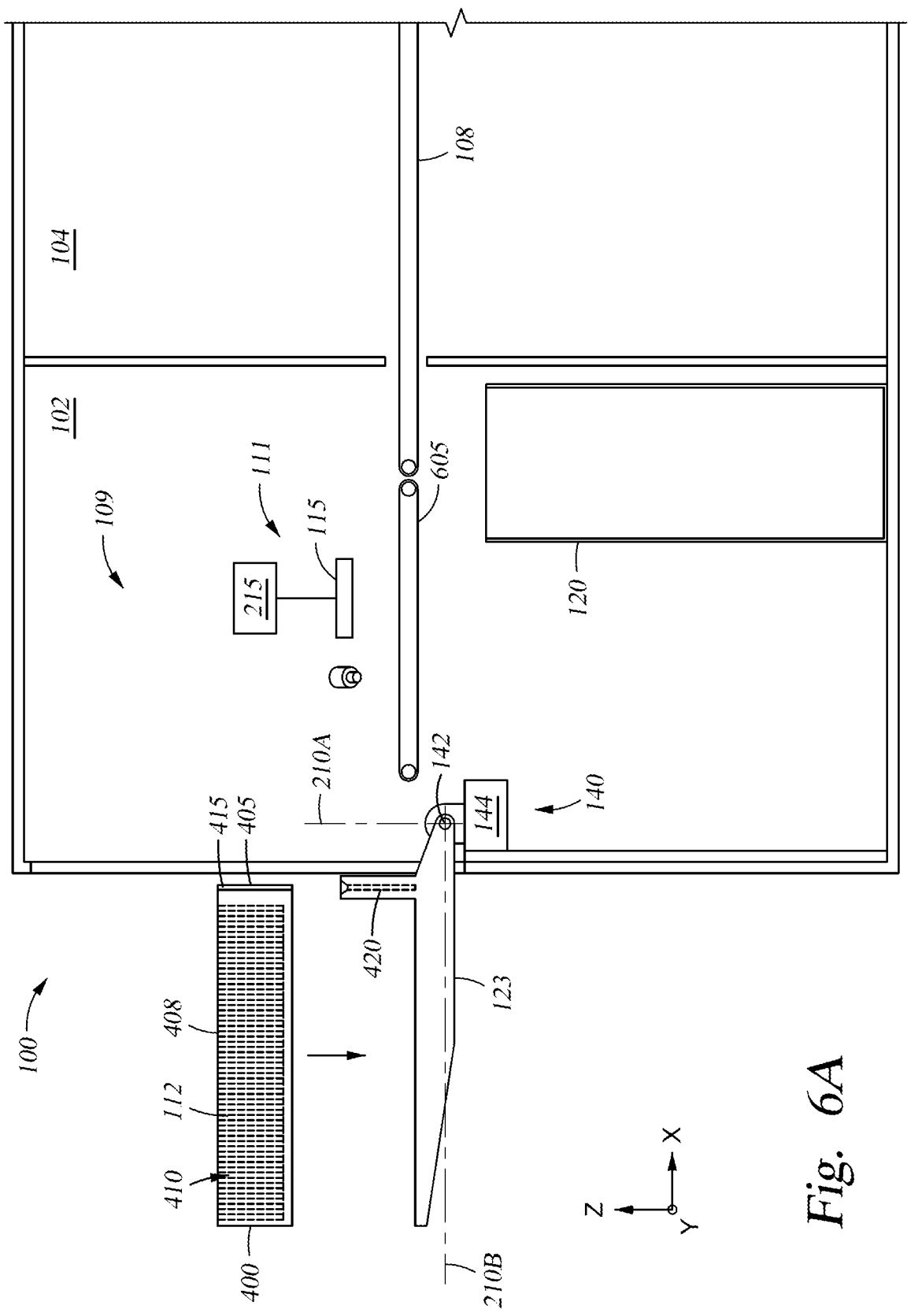

In FIG. 6A, the cassette 400 and the cassette receiver 123 are in the second orientation 210B (horizontal or cassette loading position). The cassette 400 (full of substrates 112) is attached to the cassette receiver 123, which is coupled to the hinge device 142.

Figure 6B:
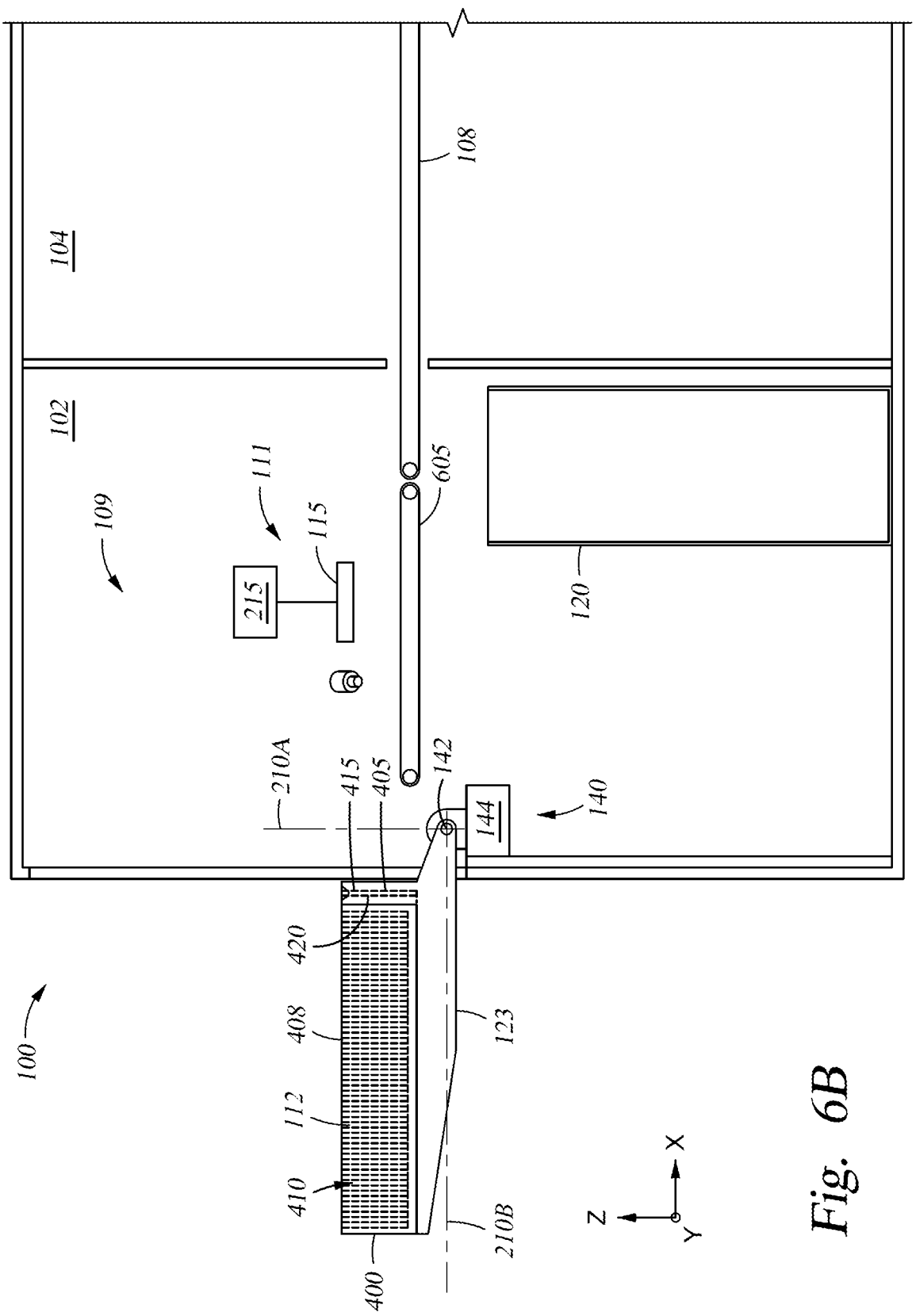
Figure 6C:
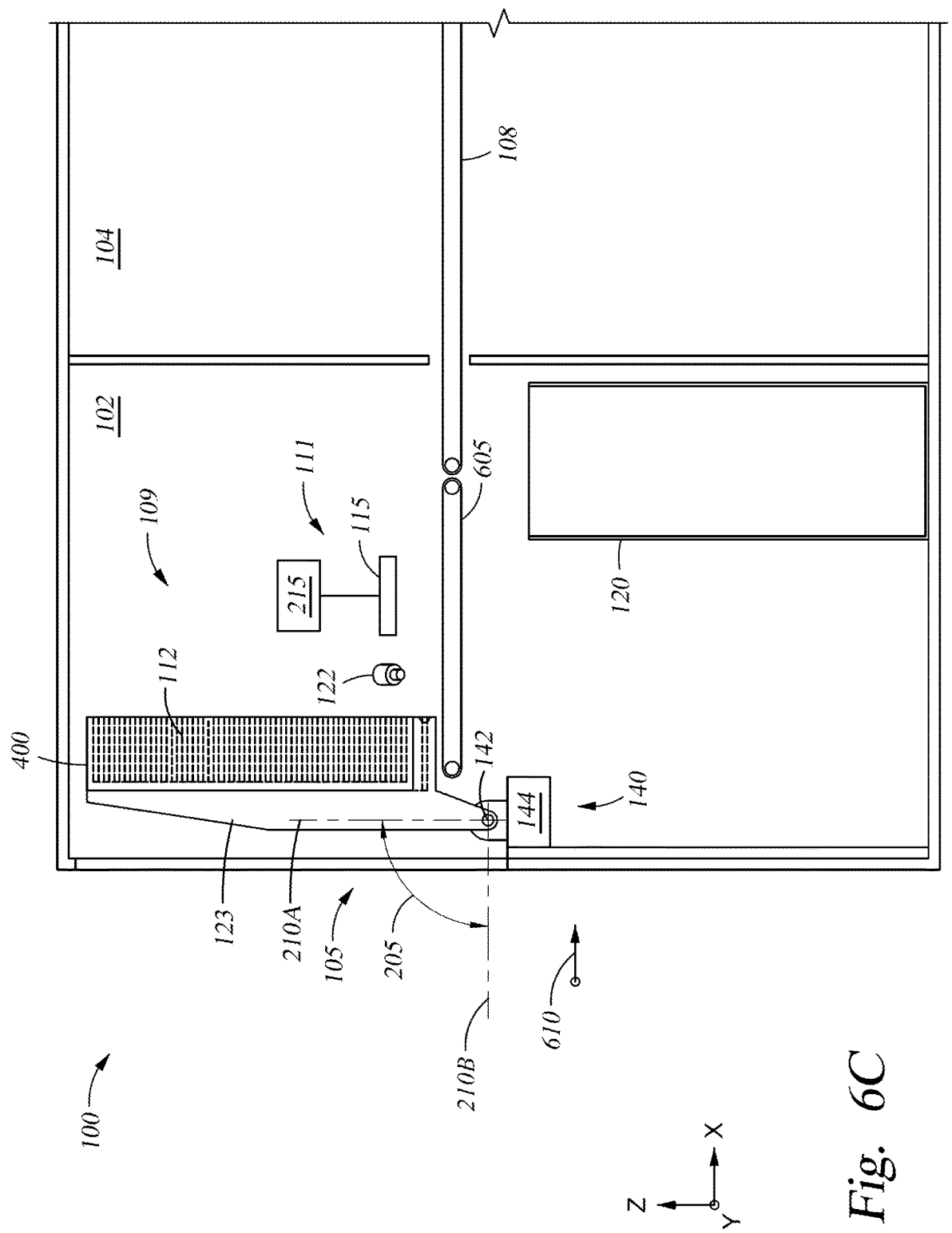
Figure 6D:
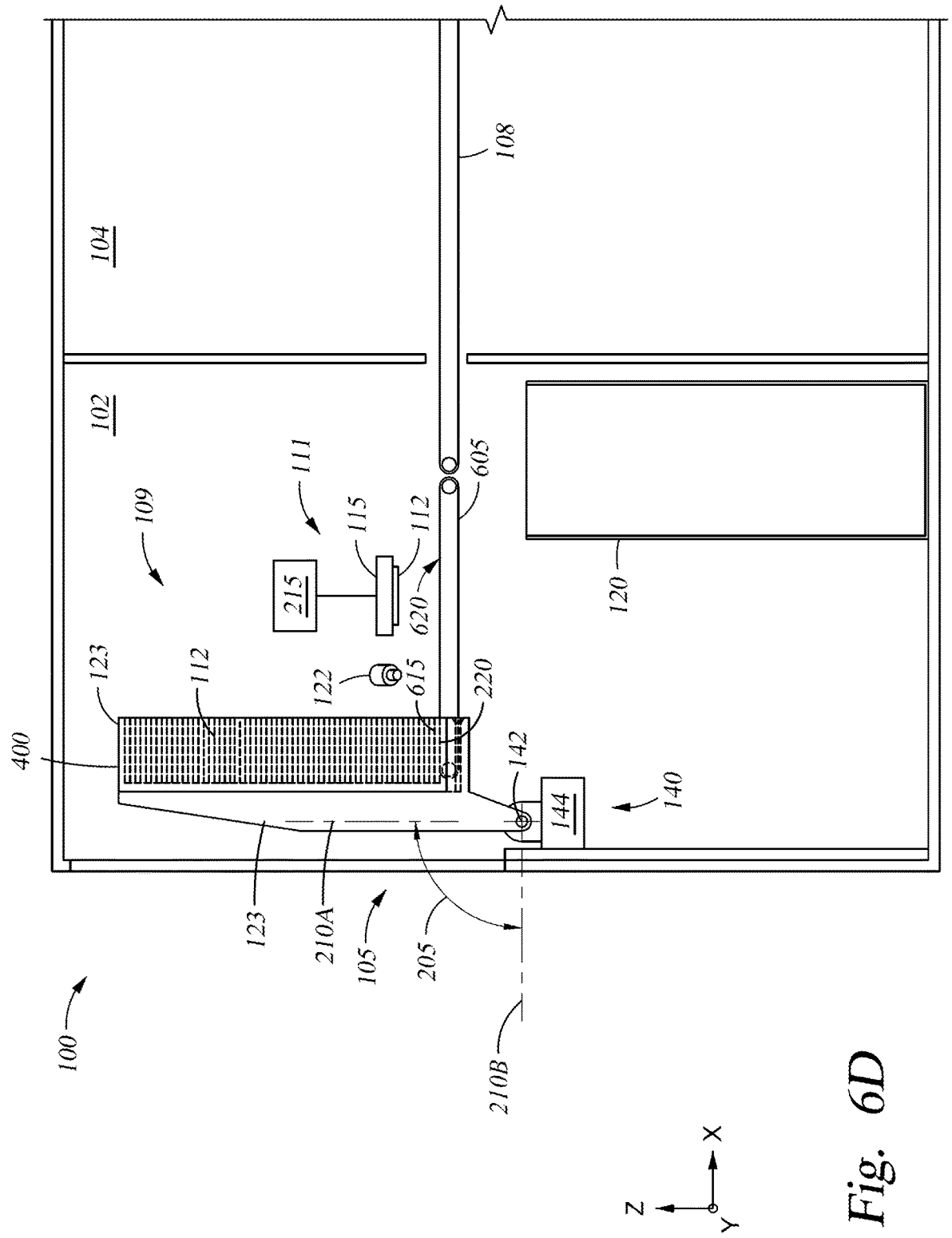

In FIGS. 6B and 6C, the cassette receiver 123 is moved in the direction 205 from the second orientation 210B to the first orientation 210A using the actuator 144. Then, shown in FIGS. 6C and 6D, the cassette transfer mechanism 140, with the cassette 400 and cassette receiver 123, is moved laterally in the direction 610 (X direction) toward the conveyor 605. The actuator 144 also moves the cassette receiver 123 and the cassette 400 vertically (Z direction) such that a lowermost substrate 615 is above a plane 620 of the upper surface of the conveyor 605. Further, in FIG. 6D, the cassette transfer mechanism 140, with the cassette 400 and cassette receiver 123, is lowered in the Z direction such that the lowermost substrate 615 contacts and is transferred by the conveyor 605 in the direction 116. The cassette transfer mechanism 140 continues to lower as substrates are transferred to the conveyor 605 until an uppermost substrate (or final substrate) 625 is positioned for transfer on the conveyor 605 (shown in FIG. 6E), After the uppermost substrate 625 is removed by the conveyor 605 from the cassette 400, the cassette transfer mechanism 140 may move in a direction away from the conveyor 605 and return the cassette 400 and the cassette receiver 123 to the second orientation 210B (shown in FIG. 6B). In this position, the cassette 400, now empty, can be replaced with another cassette 400 full of substrates 112.

It will be appreciated to those skilled in the art that the preceding examples are exemplary and not limiting. In some embodiments, the principles described herein are applicable to non-solar substrates, such as integrated circuit substrates. It is intended that all permutations, enhancements, equivalents, and improvements thereto that are apparent to those skilled in the art upon a reading of the specification and a study of the drawings are included within the true spirit and scope of the present disclosure. It is therefore intended that the following appended claims include all such modifications, permutations, and equivalents as fall within the true spirit and scope of these teachings.

What is claimed is:

1. A method of transporting substrates, comprising:
   unloading a first plurality of substrates from a first cassette onto a first conveyor;
   positioning a second cassette at a second conveyor while unloading the first plurality of substrates from the first cassette;
   unloading a second plurality of substrates from the second cassette onto the second conveyor;

positioning a third cassette at the first conveyor while unloading the second plurality of substrates from the second cassette; and transferring at least a portion of the second plurality of substrates from the second conveyor to the first conveyor via a third conveyor.

2. The method of claim 1, wherein positioning the second cassette at the second conveyor comprises positioning the second cassette such that an end of the second conveyor is located beneath the second plurality of substrates.

3. The method of claim 2, wherein unloading the second plurality of substrates from the second cassette onto the second conveyor comprises:

moving the second cassette down relative to the second conveyor;

resting a first substrate of the second plurality of substrates on the second conveyor; and operating the second conveyor to move the first substrate out of the second cassette.

4. The method of claim 3, wherein unloading the second plurality of substrates from the second cassette onto the second conveyor further comprises:

continuing downward motion of the second cassette relative to the second conveyor such that successive substrates of the second plurality of substrates sequentially rest on the second conveyor; and operating the second conveyor to move each substrate sequentially out of the second cassette.

5. The method of claim 1, further comprising inspecting each substrate of the second plurality of substrates on the second conveyor.

6. The method of claim 5, further comprising:

identifying an undesired substrate of the second plurality of substrates; and transferring the undesired substrate to a bin.

7. The method of claim 1, further comprising transporting the first and second pluralities of substrates to an inspection unit as a continuous stream of substrates.

8. A method of transporting substrates, comprising:

positioning a first cassette such that an end of a first conveyor is located beneath a first plurality of substrates in the first cassette;

unloading the first plurality of substrates from the first cassette onto a top surface of the first conveyor by:

moving the first cassette down relative to the first conveyor;

sequentially resting each substrate on the first conveyor; and operating the first conveyor to move each substrate sequentially out of the first cassette; and transferring a second plurality of substrates from a bottom of a second conveyor to the first conveyor, such that the first and second pluralities of substrates form a continuous stream of substrates traveling on the first conveyor.

9. The method of claim 8, further comprising positioning a second cassette containing the second plurality of substrates at a third conveyor while unloading the first plurality of substrates from the first cassette.

10. The method of claim 9, further comprising unloading the second plurality of substrates from the second cassette onto a top surface of the third conveyor.

11. The method of claim 10, further comprising inspecting each substrate of the second plurality of substrates on the third conveyor.

12. The method of claim 11, further comprising using the second conveyor to pick up each substrate of the second plurality of substrates from the top surface of the third conveyor.

13. A method of transporting substrates, comprising:

unloading a first plurality of substrates from a first cassette onto a first conveyor that is disposed under the substrates disposed in the first cassette;

unloading a second plurality of substrates from a second cassette onto a second conveyor that is disposed under the substrates disposed in the second cassette, the second conveyor having an orientation parallel to the first conveyor;

transferring the second plurality of substrates from the second conveyor to a bottom of a third conveyor that is disposed over the second conveyor; and transferring the second plurality of substrates from the third conveyor to the first conveyor, the first conveyor disposed under the third conveyor.

14. The method of claim 13, further comprising inspecting each substrate of the first plurality of substrates on the first conveyor.

15. The method of claim 14, further comprising:

identifying an undesired substrate of the first plurality of substrates; and transferring the undesired substrate to a bin.

16. The method of claim 13, further comprising:

unloading an undesired substrate from the second cassette onto the second conveyor;

identifying the undesired substrate while the undesired substrate is on the second conveyor; and transferring the undesired substrate to a bin.

17. The method of claim 16, wherein transferring the undesired substrate to the bin comprises transporting the undesired substrate on the second conveyor beneath the third conveyor without picking up the undesired substrate with the third conveyor.

18. The method of claim 13, wherein the first and second pluralities of substrates form a continuous stream of substrates traveling on the first conveyor.

19. The method of claim 18, further comprising transporting the continuous stream of substrates to an inspection unit.

* * * * *